(12) United States Patent
Park (10) Patent No.: US 8,358,257 B2
(45) Date of Patent: Jan. 22, 2013

(54) OPERATING SYSTEM AND METHOD OF LIGHT EMITTING DEVICE

(75) Inventor: Jun Sung Park, Seoul (KR)

(73) Assignee: LG Electronics Inc., Seoul (KR)

( * ) Notice: Subject to any disclaimer, the term of this patent is extended or adjusted under 35 U.S.C. 154(b) by 1076 days.

(21) Appl. No.: 11/836,625

(22) Filed: Aug. 9, 2007

(65) Prior Publication Data

US 2008/0036713 A1 Feb. 14, 2008

(30) Foreign Application Priority Data

Aug. 10, 2006 (KR) .................. 10-2006-0075666

(51) Int. Cl.
*G09G 3/32* (2006.01)
(52) U.S. Cl. .......................................... 345/82
(58) Field of Classification Search ............. 385/92; 362/264; 713/500; 345/82
See application file for complete search history.

(56) References Cited

U.S. PATENT DOCUMENTS

| 5,821,692 | A | 10/1998 | Rogers et al. | |
|---|---|---|---|---|
| 6,480,389 | B1 | 11/2002 | Shie et al. | |
| 6,586,890 | B2 * | 7/2003 | Min et al. | 315/224 |
| 7,301,284 | B2 | 11/2007 | Ito et al. | |
| 2002/0097201 | A1 | 7/2002 | Yamamoto et al. | |
| 2003/0076034 | A1 * | 4/2003 | Marshall et al. | 313/512 |
| 2004/0105264 | A1 | 6/2004 | Spero | |
| 2004/0160173 | A1 * | 8/2004 | Shen et al. | 313/506 |
| 2005/0025438 | A1 * | 2/2005 | Go et al. | 385/92 |
| 2005/0071705 | A1 * | 3/2005 | Bruno et al. | 713/500 |
| 2005/0128441 | A1 * | 6/2005 | Morgan | 353/102 |
| 2005/0189518 | A1 * | 9/2005 | Arakawa | 252/301.6 S |
| 2006/0214274 | A1 * | 9/2006 | Shimokawa et al. | 257/678 |
| 2007/0120138 | A1 * | 5/2007 | Sayers et al. | 257/99 |
| 2007/0194422 | A1 * | 8/2007 | Lai et al. | 257/684 |
| 2008/0013316 | A1 * | 1/2008 | Chiang | 362/264 |
| 2008/0297644 | A1 | 12/2008 | Farchtchian et al. | |

FOREIGN PATENT DOCUMENTS

| EP | 1 453 363 A1 | 9/2004 |
|---|---|---|
| EP | 1 647 966 A1 | 4/2006 |
| JP | 2003-188415 A | 7/2003 |
| JP | 2003-347594 A | 12/2003 |
| JP | 2004-071357 A | 3/2004 |
| JP | 2005-197399 A | 7/2005 |
| JP | 2006-086063 A | 3/2006 |
| JP | 2006-148051 A | 6/2006 |
| JP | 2006-276784 A | 10/2006 |
| KR | 2001-0093337 B1 | 10/2001 |
| KR | 2006-0056323 A | 5/2006 |
| WO | WO 2004/100612 A1 | 11/2004 |
| WO | WO 2006/002607 A2 | 1/2006 |
| WO | WO 2006/056066 A1 | 6/2006 |

* cited by examiner

*Primary Examiner* — Quan-Zhen Wang
*Assistant Examiner* — Tony Davis
(74) *Attorney, Agent, or Firm* — Birch, Stewart, Kolasch & Birch, LLP (57) ABSTRACT

An operating system for estimating thermal property of a light emitting device to operate the light emitting device, and an operating method thereof are disclosed. The operating system of a light emitting device includes a light emitting device package and a driving unit to drive the light emitting device package at frequency equal to or higher than 100 Hz.

16 Claims, 7 Drawing Sheets

OPERATING SYSTEM AND METHOD OF LIGHT EMITTING DEVICE

This application claims the benefit of Korean Patent Application No. P2006-0075666, filed on Aug. 10, 2006, which is hereby incorporated by reference as if fully set forth herein.

BACKGROUND OF THE INVENTION

1. Field of the Invention

The present invention relates to an operating system of a light emitting device, and more particularly, to an operating system for estimating thermal property of a light emitting device to operate the light emitting device, and an operating method thereof.

2. Discussion of the Related Art

A light emitting diode (LED) is a semiconductor light emitting device to convert electric current into light. A red LED using a GaAsP compound semiconductor is firstly produced in 1962, and the red LED and a GaP:N based green LED are used as light sources for displays of electronic apparatuses including information and telecommunication equipments.

The wavelength of light emitted from the LEDs is dependent on semiconductor material used to manufacture the LEDs. This is because the wavelength of the emitted light depends on a band-gap of the semiconductor material, indicating an energy difference between valence band electrons and conduction band electrons.

A gallium nitride (GaN) compound semiconductor is spotlighted in the field of developing a high-output electronic device due to the high thermal stability and the broad band gap (0.8 eV to 6.2 eV). One of reasons why the GaN compound semiconductor is spotlighted is that GaN is combined with other elements such as indium (In), aluminum (Al), and the like to form semiconductor layers to emit green light, blue light, and white light.

As described above, since the emission wavelength can be adjusted, properties of materials can be adjusted in accordance with the property of a specific device. For example, GaN is used to fabricate a white LED capable of replacing the blue LED and an incandescent lamp useful in the optical recording.

Moreover, the conventional green LED is implemented by GaP in the early stage. Since GaP has a low efficiency as an indirect transition material, it is impossible to emit a pure green light. As the growth of InGaN thin films is succeeded, it is possible to implement a high-brightness green LED.

Due to the above-described advantages and other advantages, markets for the GaN based LEDs is rapidly developed. Thus, technologies relating to the optoelectronic devices are also rapidly developed since 1994 when the GaN based LEDs are commercially introduced.

Since the efficiency of the GaN light emitting diode is superior to that of the incandescent lamp, and is substantially equal to that of a fluorescent lamp now, there is an expectation that the market for the GaN based LED continuous the rapid growth.

As such, the LEDs are used in various fields such as a traffic light, a vehicle, a display, and the like, the brightness is remarkably enhanced to 60 μm/W.

Moreover, according to another advantage of the LED, various colors can be implemented, a prompt driving is possible, the lifespan is 100 thousand hours, and there is no risk of explosion.

Due to the above-mentioned advantages, the majority of illumination devices are anticipated to be replaced with the LED within 10 years in the future.

Figure 1:
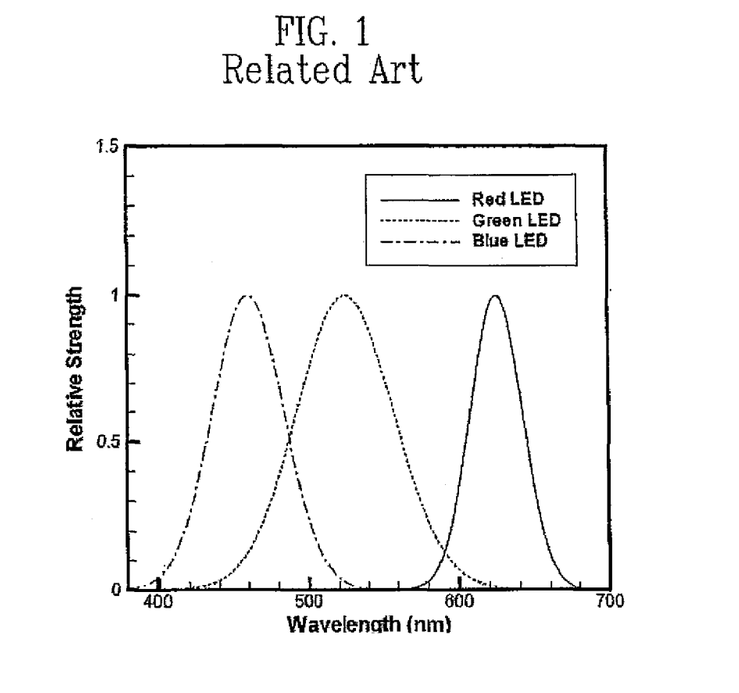
FIG. 1 is a graph illustrating a light emitting property of a conventional light emitting device.
Figure 2:
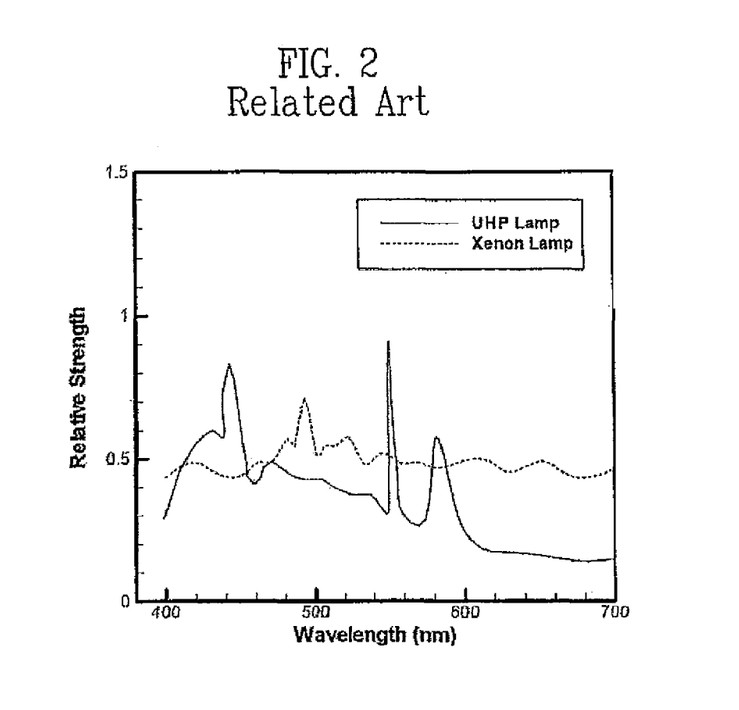
FIG. 2 is a graph illustrating a light emitting property of a conventional lamp.

Particularly, almost colors can be expressed using the three primary colors of light in comparison to other illumination devices. Moreover, in the red light R, the green light G, and the blue light B, as illustrated in FIG. 1, the frequencies and wavelengths of the LEDs are obviously districted in comparison to the wavelengths of FIG. 2.

In other words, the lamp contains spectrums such as ultraviolet rays UV or infrared rays IR, but the LED light source has a pure wavelength.

As the illuminance of the LED is remarkably enhanced, the optical efficiency is expected to be significantly increased.

However, presently, in comparison to the fluorescent lamp or the lamp having an efficiency of 30 μm/W to 100 lm/W, the red LED has about 40 lm/W, the green LED has about 20 lm/W, and the blue LED has about 8 lm/W.

In order to increase the optical efficiencies of the LEDs to that of other lamp, a high efficiency and a high driving current are required. However, the high driving current causes more power consumption. Thus, when a high brightness LED is driven, temperature of the LED chip is very high.

As such, the LED, the application range of which is widely increased in the display field today, is repeatedly turned on and off few tens to few hundreds for a second for the implementation of an image.

Thus, this duty operation must be considered when designing a driving design relating to the temperature of the LED.

The LED is a semiconductor device to convert electric energy into a light energy. Thus, the LED has the property of the semiconductor as it is, and as a result, the principal properties of the LED such as the brightness, the lifespan, a voltage, and the like are remarkably varied according to temperature.

Accordingly, prior to design of a product and the application of the LED, it is required a method of precisely estimate temperature of a chip to emit light as a core part of the LED.

SUMMARY OF THE INVENTION

Accordingly, the present invention is directed to an operating system and a method of a light emitting device that substantially obviates one or more problems due to limitations and disadvantages of the related art.

An object of the present invention is to provide an operating system for driving a light emitting device such that junction temperature of a light emitting device package can be estimated within a small error range without direct measurement through an analyze of a thermal property of the light emitting device package, and a method of driving the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an operating system of a light emitting device comprising: a light emitting device package; and a driving unit to drive the light emitting device package at frequency equal to or higher than 100 Hz.

To achieve these objects and other advantages and in accordance with the purpose of the invention, as embodied and broadly described herein, an operating system of a light emitting device comprising: a plurality of light emitting devices; and a driving unit to drive the light emitting devices at frequency equal to or higher than 100 Hz.

To achieve these objects and other advantages and in accordance with the purpose of the invention, as embodied and broadly described herein, a method of driving a light emitting device comprising at least one light emitting device package, comprising: driving the light emitting device package at frequency equal to or higher than 100 Hz.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an operating system of a light emitting device according to the preferred embodiment of the present invention and a method of driving the same will be described in detail with reference to the accompanying drawings.

Figure 3:
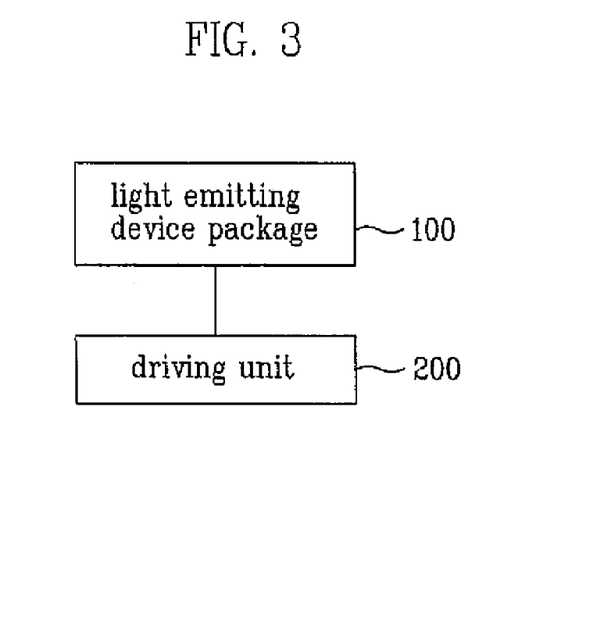
FIG. 3 is a schematic view illustrating an operating system of a light emitting device according to an embodiment of the present invention.

As illustrated in FIG. 3, the operating system of a light emitting device includes a light emitting device package 100 and a driving unit 200 to drive the light emitting device package 100.

The driving unit 200 can drive the light emitting device package 100 at 100 Hz and higher frequencies.

Figure 4:
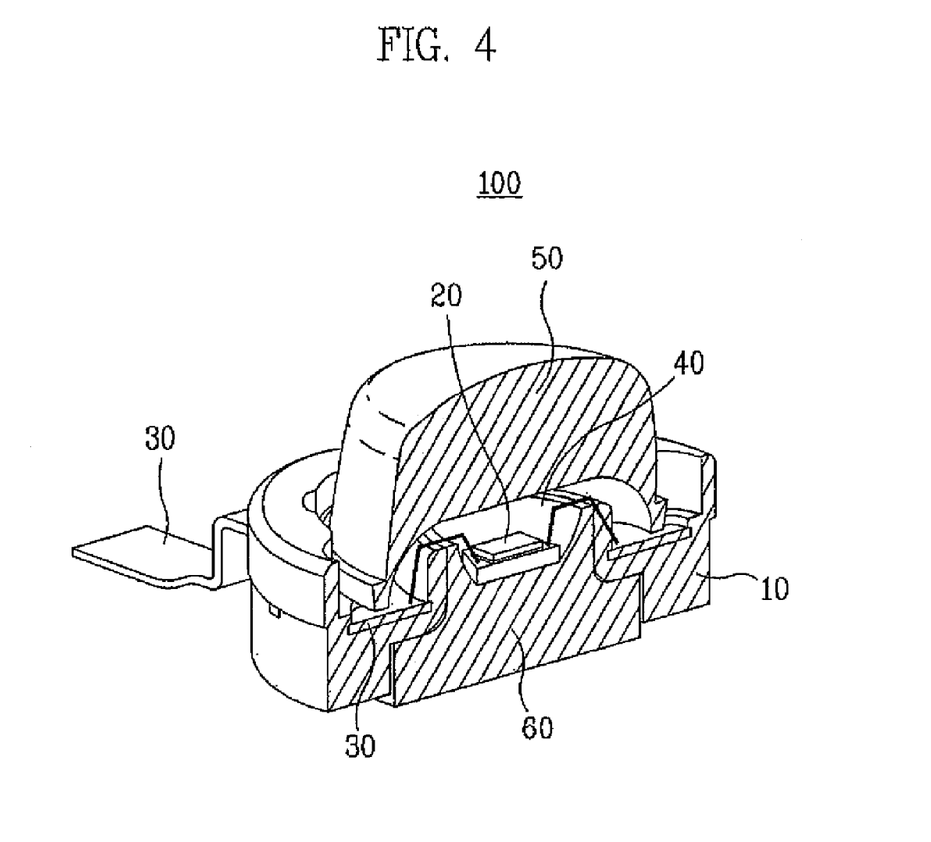
FIG. 4 is a fragmentary sectional perspective view illustrating an example of a light emitting device package according to an embodiment of the present invention.

The light emitting device package 100, as illustrated in FIG. 4, may include a light emitting device chip 20, and a heat sink 60 contacting the light emitting device chip 20.

In this case, a solder ball and epoxy (not shown) may disposed between the light emitting device chip 20 and the heat sink 60, and encapsulant 40 and a lens 50 may be disposed upper the light emitting device chip 20.

The light emitting device chip 20 may employ any one or more GaAs, InP, InGaP, and GaN based light emitting devices.

The driving unit 200 may perform a duty operation and may drive the light emitting device package 100 at frequencies under 2 kHz.

When the light emitting device package 100 is driven at the above-mentioned frequencies, it is possible to decrease an error of the junction temperature of the light emitting device package 100.

Figure 5:
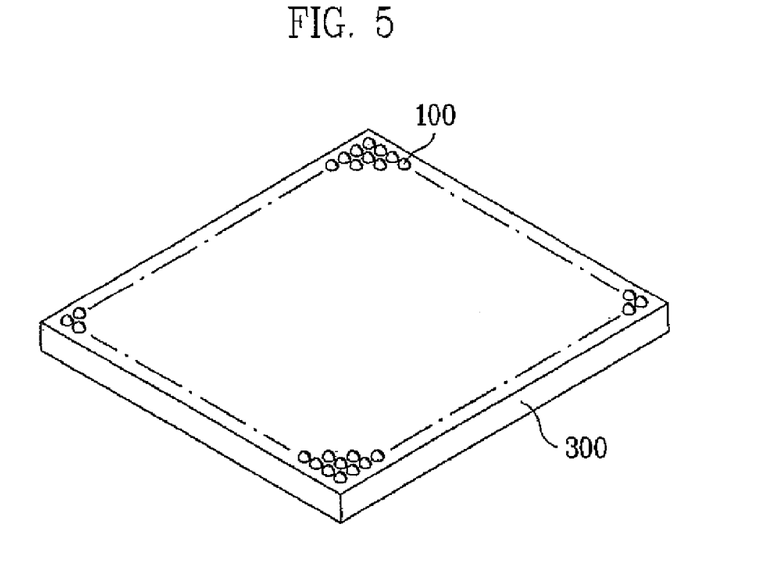
FIG. 5 is a perspective view illustrating an operating system of a light emitting device according to another embodiment of the present invention.

Moreover, a plurality of the light emitting device packages 100, as illustrated in FIG. 5, may be arranged on a panel 300 having a predetermined area.

As such, the plurality of the light emitting device packages 100 may be a full color display, and may be a backlight unit to emit a specific colored light according to circumstance. Particularly, the light emitting device packages 100 may be used as a backlight unit of a liquid crystal display.

The light emitting device package 100 emits light from a light emit chip 20 as well as a considerable heat.

Heat generated in the light emitting device chip 20 flows along a heat path in the light emitting device package 100, and the light emitting device package 100 is grouped into a low power light emitting device package and a high power light emitting device package according to designed property for the heat path.

This property can be actualized by thermal resistance. Since the thermal resistance is a very important value to determine the property of the light emitting device, the value of the thermal resistance is written on the respective light emitting device packages.

In order to know a precise junction temperature of the light emitting device, a temperature measuring probe is mounted to the junction to measure the same. Since the light emitting device is a device to emit light, the measuring error is very large, particularly in the high power light emitting device.

Thus, when temperature of other parts except for the junction of the light emitting device is measured by a simple measuring device such as a thermocouple, the junction temperature of the light emitting device can be estimated through the thermal resistance R of the light emitting device package 100, contrariwise.

However, during the duty operation of repeating the turning-on/off, error for the estimation may be very large.

Hereinafter, the relationship of the light emitting device between the junction temperature and the driving frequency of the light emitting device will be described in detail.

The most of light emitting devices is used as an indicating light or an indicator up to now. However, as an innovational heat discharging structure is developed recently, the brightness of the light emitting device is improved higher than 60 μm/W. Thus, this light emitting device can be applied to the simple indicating light as well as an illumination and a display, and accordingly, a high illuminant flux is required to this end.

As described above, the improvement of the brightness of the light emitting device can be realized by a large driving current or power.

Generally, the size of the light emitting device chip is very small. Thus, heat generated in a unit area easily exceeds 1 MW/m$^2$. An effective heat discharging structure is a very important element in the light emitting device package.

Accordingly, the effective heat discharging structure of the light emitting device plays a more important role in the quality, the energy efficiency, the stability, and the lifespan of the light emitting device.

Among these high power light emitting devices, a light emitting device package 100 having the structure as illustrated in FIG. 4 may be driven under the condition where the current exceeds approximately 1400 mA.

As described above, the light emitting device package 100 is configured by which the light emitting device chip 20 is bonded to a package body 10 by a solder and is connected to a lead 30.

Moreover, the encapsulant 40 such as epoxy is filled in the upper surface of the light emitting device chip 20, and the lens 50 may be disposed upper the encapsulant 40.

Meanwhile, the package body 10 to which the light emitting device chip 20 is bonded includes the heat sink 60 to effectively discharge the heat.

The reason why this structure of the light emitting device package 100 stands such the high power is because a considerable heat is discharge through the heat discharging structure, and thus the thermal resistance can be significantly reduced.

The heat discharging path of the light emitting device package 100 is mainly constituted by the light emitting device chip 20, the solder ball (not shown) to which the light emitting device chip 20 is bonded, the encapsulant 40, and the heat sink 60.

The light emitting device package 100, as illustrated in FIG. 3, may be driven by a separated driving unit 200.

As described above, in the light emitting device package 100 as illustrated in FIG. 4, light generated from the light emitting device chip 20 is discharged through the encapsulant 40 and the lens 50, and the majority of heat generated in the light emitting device chip 20 is discharged or conducted through the heat sink 60.

The heat sink 60 is fabricated by aluminum with a large thermal conductivity (approximately 200 W/mK). Thus, the heat generated during the driving of the light emitting device package 100 is transferred to the surroundings via a thermal interface material (TIM) and the external heat sink 60.

In this case the thermal interface material (not shown) is used to reduce a thermal contact resistance between the heat sink 60 of the light emitting device package 100 and the exterior.

Modeling of the thermal interface material and the heat sink 60 may be replaced with the thermal resistance $R_{TIM+heatsink}$. When considering thermal resistances of usual thermal interface material (0.01° C./W to 0.2° C./W) and the heat sink (higher than 0.3° C./W), $R_{TIM+heatsink}$ may be selected by 1.0° C./W.

Moreover, there are the solder ball and the electric and thermal conductor, i.e., the conductive epoxy between the light emitting device chip 20 and the heat sink 60. The thermal resistance due to the solder ball and the epoxy can be simply selected by $T_{epoxy+\ solder\ balls}$=10.42° C./W.

The thermal resistance of the light emitting device package 100 having the structure as illustrated in FIG. 4 is reported as 13° C./W. Theoretically, not only a spreading resistance but also the thermal resistance of the heat sink 60 can be obtained from known structures and materials. A value added by these is approximately 2.58° C./W.

In fact, although the solder ball and the epoxy occupy the same area as that of the light emitting device chip 20 and are very thin, the thermal resistance thereof is approximately 1 W/mK. Thus, the solder ball and the epoxy play a great role as a thermal resistor in the heat path.

Since the effects of the solder ball and the epoxy must be considered, the light emitting device chip 20, the solder ball, the epoxy, the heat interface material, and the heat sink 60 of the light emitting device package 100 must be considered in the heat analyze.

Figure 6:
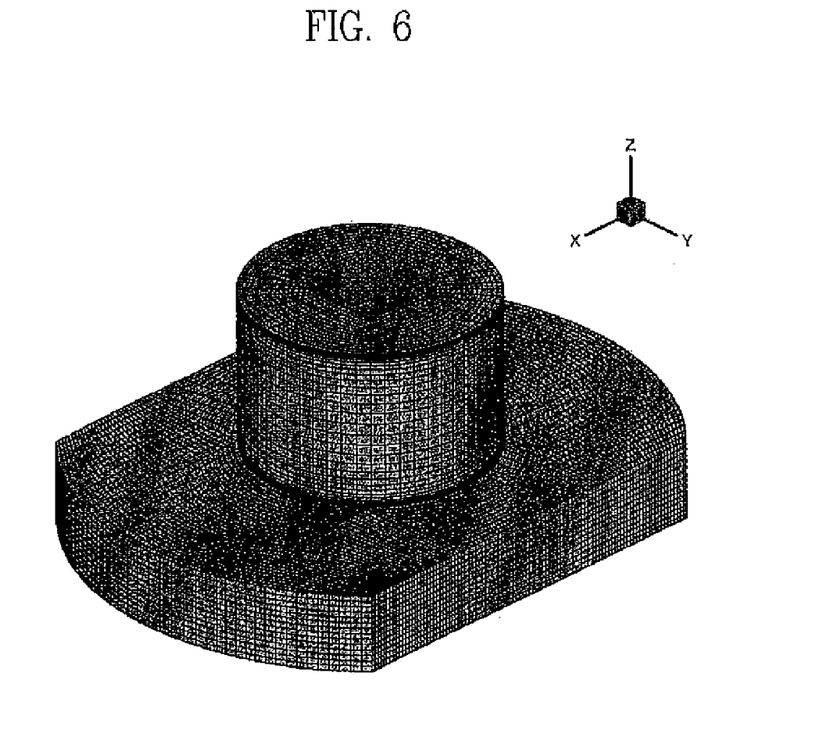
FIG. 6 is a perspective view illustrating an illustration for the analyze of a heat flow according to the embodiment of the present invention.

As illustrated in FIG. 6, the light emitting device chip 20 and the heat sink 60 of the light emitting device package 100 can be divided into plural polyhedrons. In the case of FIG. 6, approximately 8,300 meshes are used.

When considering the heat interface material and the heat sink 60 by applying the relationship between temperature of a bottom of the heat sink 60 and the atmospheric temperature $T_a$, the following formula can be obtained.

$$T_{LED\ heat\ sink\ k\ at\ bottom} = T_a + R_{TIM+heatsink\ k} \times P \quad \text{[Formula 1]}$$

where, P represent power or heat discharge of the light emitting device chip 20 and is expressed the following formula 2.

$$P = \lambda_{heat\ sink} \frac{\partial T}{\partial x_i} \frac{\partial T}{\partial x_i}\bigg|_{LED\ heat\ sink\ at\ bottom} \times \Delta A \quad \text{[Formula 2]}$$

In order to analyze the junction temperature of various light emitting device packages 100 with respect the driving frequency and the duty cycle, a three-dimensional conductive equation may be applied as follows.

$$\rho C_P \frac{\partial T}{\partial t} \frac{\partial}{\partial x}\left(\lambda \frac{\partial T}{\partial x}\right) + \frac{\partial}{\partial y}\left(\lambda \frac{\partial T}{\partial y}\right) + \frac{\partial}{\partial z}\left(\lambda \frac{\partial T}{\partial z}\right) \quad \text{[Formula 3]}$$

where, $\rho$ and $C_p$ represent respectively a density $\rho_{LED\ chip}$ or $\rho_{heat\ sink}$ and a heat capacity $C_{P,\ LED\ chip}$ or $C_{P,\ heat\ sink}$.

The size of the light emitting device chip 20 having the structure in FIG. 4 is configured by an area 1 mm$_2$ and a thickness 0.1 mm. The energy except for the light energy emitted from the light emitting area of the light emitting device chip 20 is absorbed into the cylindrical heat sink 60 only by the means of thermal conduction.

The area of the heat sink 60 to which the light emitting device chip 20 contacts is 7.07 times that of the light emitting device chip 20. Theoretically, the thermal resistance between the light emitting device chip 20 and the heat sink 60 due to the thermal diffusion is 1.2° C./W.

In the light emitting device package 100, heat is transferred through a circular cross section, and then is diffused through the planar heat sink 60.

To this analyze, the following assumption is applied.

First, the epoxy, the solder ball, the heat interface material, and the heat sink 60 can be modeled by the thermal resistances, $R_{epoxy+\ solder\ ball}$ and $R_{TIM+\ heatsink}$.

Second, the heat transferring mode of the light emitting device package 100 is only the thermal conduction.

A physical domain is too complicated to clearly solved in analyze. Thus, the domain depicted in FIG. 3 must be divided into restricted domains. Moreover, it is not easy to divide the light emitting device package 100 into a single block, too.

Accordingly, the overall domain is divided into 19 sub-domains (See FIG. 9), and the formula 3 is estimated with respect to the respective sub-domains by a multi-block method.

All terms except for interfaces of the respective blocks are divided by a central difference scheme.

The left side of formula 3 represents a temporary temperature variation. Thus, the left side needs to be integrated with respect to time from t to t+Δt. In the present invention, a Runge-Kutta fourth order method is used as the time integration.

A lattice generating method is usually grouped into one of three categories such as a structured lattice, a multi-block lattice, and an unstructured lattice.

These categories are expressed by the neighboring relationship between physical cells and layouts within a given lattice.

The structured lattice is constructed by a solid phase structure, the non-structured lattice has no basic structure, and the multi-block lattice is usually constructed by non-constructed collection of the constructed blocks.

The multi-block lattice, as illustrated in FIG. 6, is a collection of the constructed lattices to fill the domains.

The multi-block lattice uses the most of the efficiency of the estimation of the structured lattice, but it is not easy to consider the relationship between the respective blocks.

Since geometric elements are almost independently handled, the complicated geometric structure made into the lattice is easier than the structured lattice.

However, to fill complicated geometric intersections and to form blocks of properly sharing interfaces require many helps of experts and partially cancel advantage of the multi-block method.

One of the time integration having a high precision, expressed by a positive function, non-linear, restricted by second order level is the Runge-Kutta method.

The fundamental concept of the Runge-Kutta method is to estimate the right side of the differential equation with respect to several Q values at intervals nΔt and (n+1) Δt, and to combine the estimated values in order to obtain a high order approximate value of $Q^{n+1}$.

A general form of K-stage Runge-Kutta method is expressed by formula 4.

$$Q^{(1)} = Q^n,$$
$$Q^{(2)} = Q^n + \Delta t \alpha_2 S^{(1)},$$
$$Q^{(3)} = Q^n + \Delta t \alpha_3 S^{(2)},$$
$$\vdots$$
$$Q^{(K)} = Q^n + \Delta t \alpha_K S^{(K-1)},$$
$$Q^{(N+1)} = Q^n + \Delta t \sum_{k=1}^{K} \beta_k S^{(k)}$$

[Formula 4]

where, $$\sum_{k=1}^{K} \beta_k = 1$$

for the consistency. The expression of $S^{(k)}$ means $S^{(k)}=S(Q^{(k)})$, and S is independent from time.

The most used Runge-Kutta fourth order method is defined by the following coefficients.

In other words, $\alpha_2=\frac{1}{2}$, $\alpha_3=\frac{1}{2}$, $\alpha_4=1$, $\beta_1=\frac{1}{6}$, $\beta_2=\beta_3=\frac{1}{3}$, and $\beta_4=\frac{1}{6}$, and $\alpha_2=\frac{1}{3}$, $\alpha_3=\frac{2}{3}$, $\beta_1=\frac{1}{4}$, $\beta_2=0$, and $\beta_3=\frac{3}{4}$ in the Runge-Kutta third order method.

When analyzing a temporal thermodynamic phenomenon in the light emitting device package 100, one of the most important issues in view of numerical precision and convergence is an initial condition and a boundary condition.

In the early stage, the heat interface material and the heat sink 60 are at a thermal equilibrium in the light emitting device package 100. In this case, temperature of the overall system is 25 degrees centigrade equal to the ambient temperature $T_a$.

At an external boundary of the physical domains except for the upper surface of the light emitting device chip 20 and the bottom of the heat sink 60 of the light emitting device package 100, the following adiabatic condition is used.

$$q'_{x_i} = \lambda \frac{\partial T}{\partial x_i}\bigg|_{adiabatic\ wall} = 0$$

[Formula 5]

On the upper surface of the light emitting device chip 20, heat of 3.9 W is generated, and q is scattered under the condition illustrated in Table 1. Uniform scattering is assumed. This boundary condition can be expressed by the following formula 6.

$$\frac{q}{A_{LED\ die\ upper\ surface}} = \lambda_{LED\ die} \frac{\partial T_{LED\ die}}{\partial z}\bigg|_{z=z_{max}}$$

Figure 7:
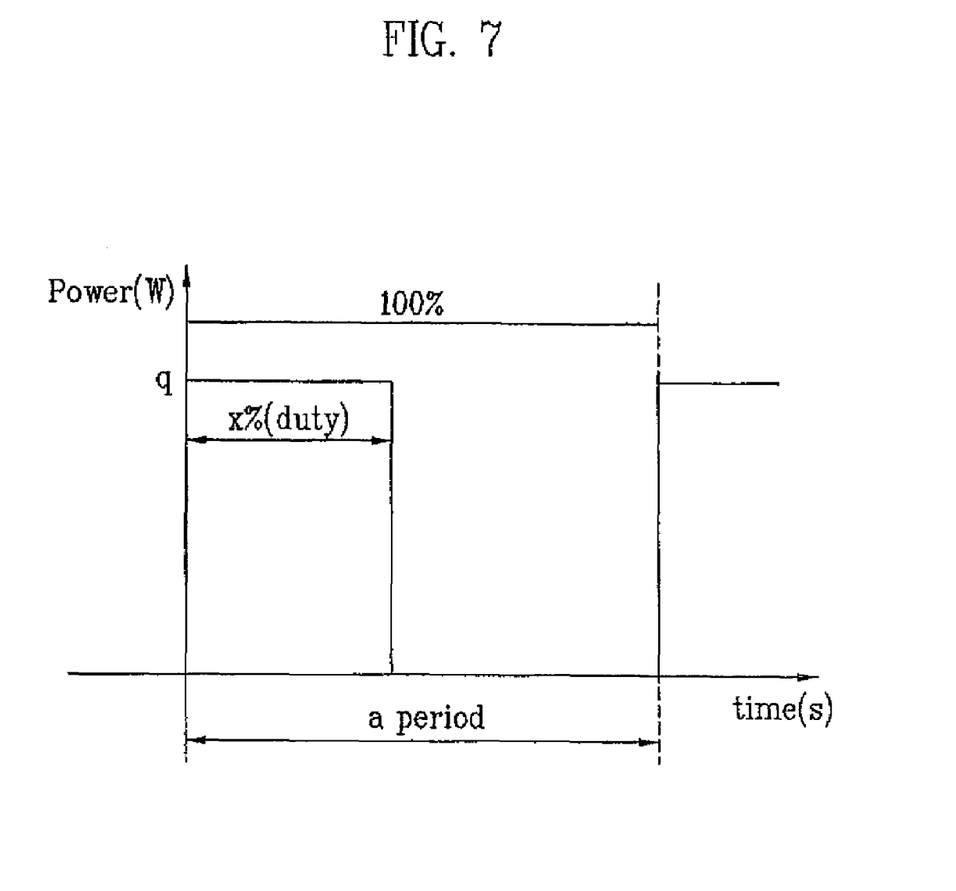
FIG. 7 is a graph illustrating a duty operation in the operating system of a light emitting device according to the embodiment of the present invention.

FIG. 7 illustrates a driving condition of the light emitting device package 100 at a period 1/f. When the light emitting device package 100 is driven at 360 Hz and the duty cycle, the period is ⅟₃₆₀ seconds, the light emitting device package 100 is turned on for ⅟₁₄₄₀ seconds, 25% of 1/f during one cycle.

TABLE 1

| | Cases | | | | | | | | |
|---|---|---|---|---|---|---|---|---|---|
| | 1 | 2 | 3 | 4 | 5 | 6 | 7 | 8 | 9 |
| Frequency, f(Hz) | | 1 | | | 60 | | | 360 | |
| Duty cycle (%) | 25 | 50 | 75 | 25 | 50 | 75 | 25 | 50 | 75 |
| $R_{epoxy+solder\ ball}$ (° C./W) | | | | | 10.42 | | | | |
| $R_{TIM\_heat\ sink}$ (° C./W) | | | | | 1.00 | | | | |

Temperature of the lower surface of the heat sink 60 of the light emitting device package 100 can be estimated by the formula 1. Here, the thermal resistances of the surface and the surroundings are constants and the values are assumed as 1.0° C./W as illustrated in Table 1.

Moreover, since the discharged flux is almost disregarded, the power P has a value approximately equal to q in the formula 1.

When the multi-block method is applied, it needs a connection condition between the sub-domains. This condition may be applied to an interface where two different materials contact each other.

This is based on the fact that the heat flux does neither increase nor decrease at the interface when there is no heat source. Thus, the relationship can be expressed by the following formula 7.

$$\lambda_i \frac{\partial T_i}{\partial x_k} = \lambda_j \frac{\partial T_j}{\partial x_i}$$

[Formula 7]

Using a numerical analysis and the initial condition and the boundary condition as described above, the reliability of the light emitting device package 100 under the duty operation can be estimated.

Up to date, the most of the researches for the light emitting device package 100 is focused on the performance and functions thereof. However, nothing is researched for the condition of the duty operation of the light emitting device package 100.

In the present invention, the numerical analysis for the duty cycle and the driving frequency is performed with respect to the reliability of the light emitting device package 100 during the duty operation.

In the present invention, the green light emitting device having the structure as illustrated in FIG. 4 is used and the material of the light emitting device is InGaP. Moreover, the heat sink 60 of the light emitting device package 100 is aluminum.

The thermal properties of the light emitting device package 100 employed in the analysis of the present invention are listed in Table 2.

TABLE 2

|  | LED Die | Heat sink in LED Package |
|---|---|---|
| Density, $\rho$ (kg/m$^3$) | 2200 | 2702 |
| Heat Capacity, $C_P$(J/kgK) | 6100 | 896 |
| Thermal Conductivity, $\lambda$ (W/mK) | 130 | 236 |

Figure 8:
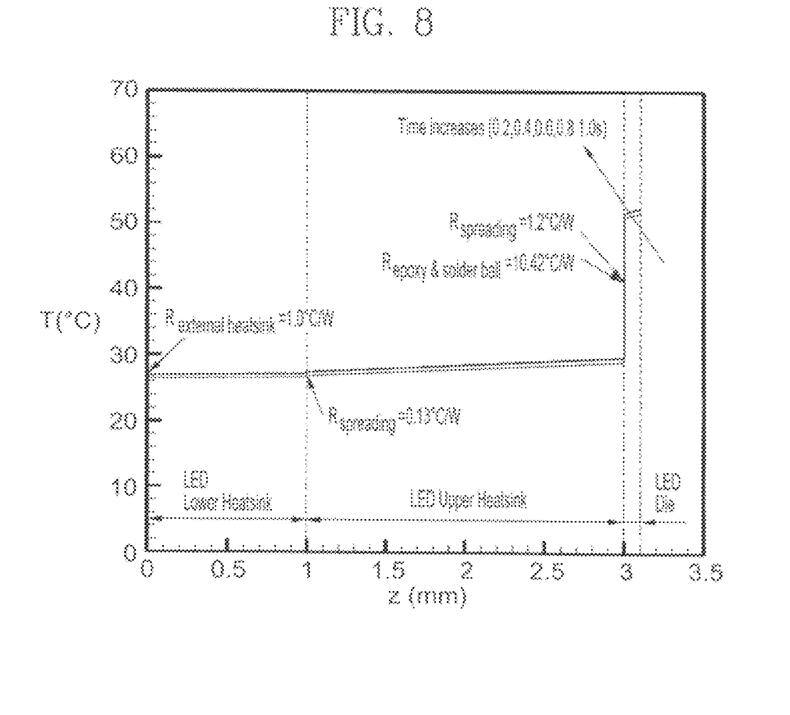
FIG. 8 is a graph illustrating temporal temperature distribution of the light emitting device package when operating the light emitting device package according to the embodiment of the present invention.

When the light emitting device package 100 is driven under 50% duty operation at 360 Hz, the temporary temperature distribution in the light emitting device package 100 is illustrated in FIG. 8.

The temperature difference $\Delta T$ between the light emitting device chip 20 and the upper heat sink 60 is very great, approximately 23 degrees centigrade because there are thermally insulated layers such as the epoxy and the solder ball.

Moreover, the small gap between the upper side of the light emitting device package 100 and the lower heat sink 60 relates to the thermal diffusion resistance.

FIG. 8 illustrates the heat distributions at 0.2 seconds, 0.4 seconds, 0.6 seconds, 0.8 seconds, and 1.0 second and these heat distributions indicate that the light emitting device package 100 reaches the thermal equilibrium under the 360 Hz and 50% duty operation within 0.5 seconds.

Consequently, it can be concluded that the light emitting device package 100 is very sensitive for the heat scattering due to the small heat capacity $\rho C_P V$.

Figure 9:
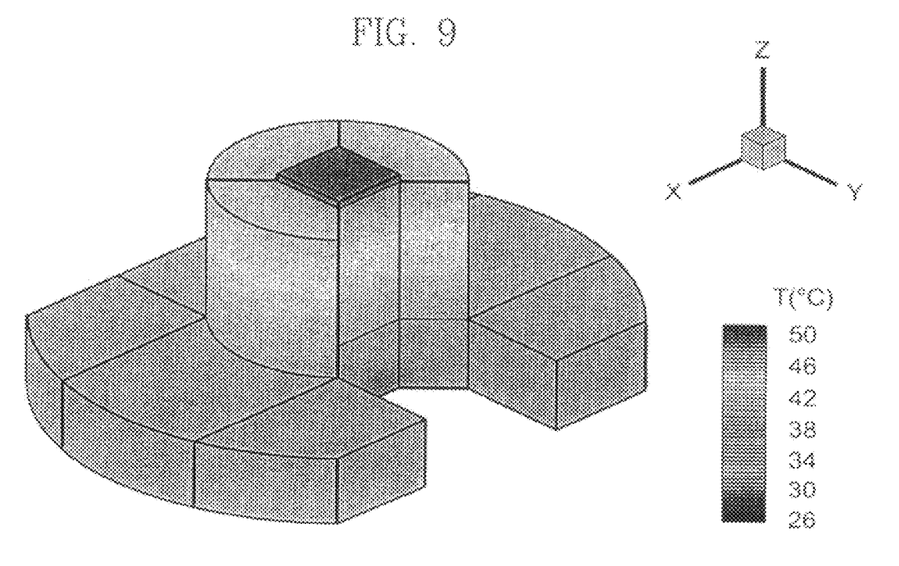
FIG. 9 is a perspective view illustrating another illustration for the analyze of a heat flow according to the embodiment of the present invention.

FIG. 9 illustrates the temperature distribution of the light emitting device package 100 at t=0.5 seconds for f=360 Hz and 50% duty operation.

The temperature difference between the upper surface and the lower surface of the light emitting device chip 20 appears very small because of the thickness 0.1 mm.

Moreover, there is no notable temperature change in the heat sink 60. However, the temperature of the light emitting device chip 20 is very different from that of the heat sink 60.

The reason is because the epoxy and the solder ball are positioned between the light emitting device chip 20 and the heat sink 60, and the thermal diffusion resistance between the light emitting device chip 20 and the heat sink 60 is approximately equal to or less than 1.2° C./W.

The highest temperature is measured at the upper surface of the light emitting device chip 20. The influence of the driving frequency and the duty cycle on the light emitting device chip 20 at the highest temperature illustrated in FIG. 10.

Figure 10:
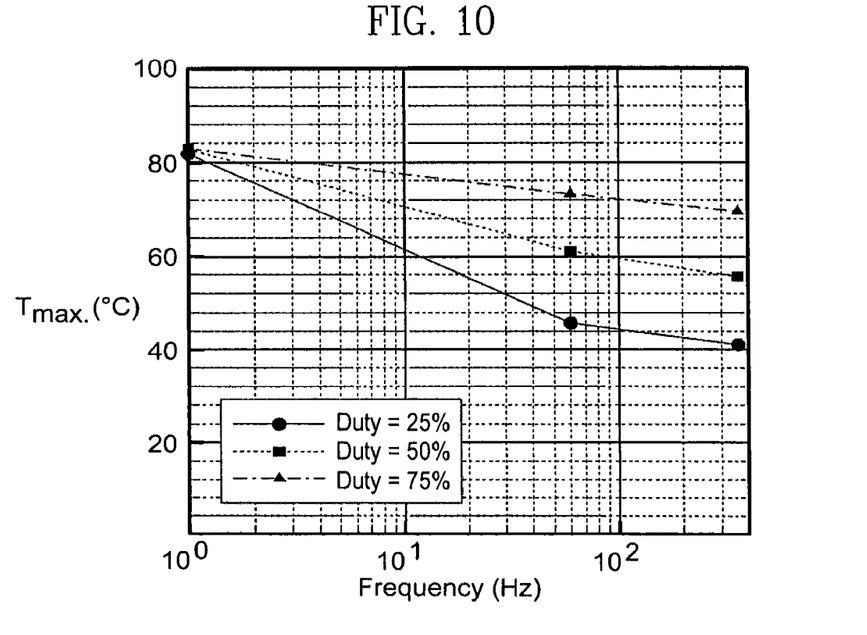
FIG. 10 is a graph illustrating variation of measured temperature with respect to driving frequencies.

When disregarding the duty cycle, the highest temperature of the light emitting device chip 20 suddenly decreases as the driving frequency f increases. Consequently, a thermally insulating line can be expressed as follows.

$$T_{max} = T_a + (R_{LED\,package} + R_{external\,heatsin\,k}) \times W \times \text{duty} \quad \text{[Formula 8]}$$

In other words, as the driving frequency is high, the light emitting device package 100 more easily reaches the thermal equilibrium. When following asymptotic curve of temperature, the respective driving conditions are like as listed in Table 3.

TABLE 3

|  | Duty Cycle | | |
|---|---|---|---|
|  | 25% | 50% | 75% |
| $T_{max}$ | 38.7° C. | 52.3° C. | 66.0° C. |

To say simply, the moment when the temperature of the light emitting device chip 20 is maximal can be estimated by the duty by the period.

Figure 11:
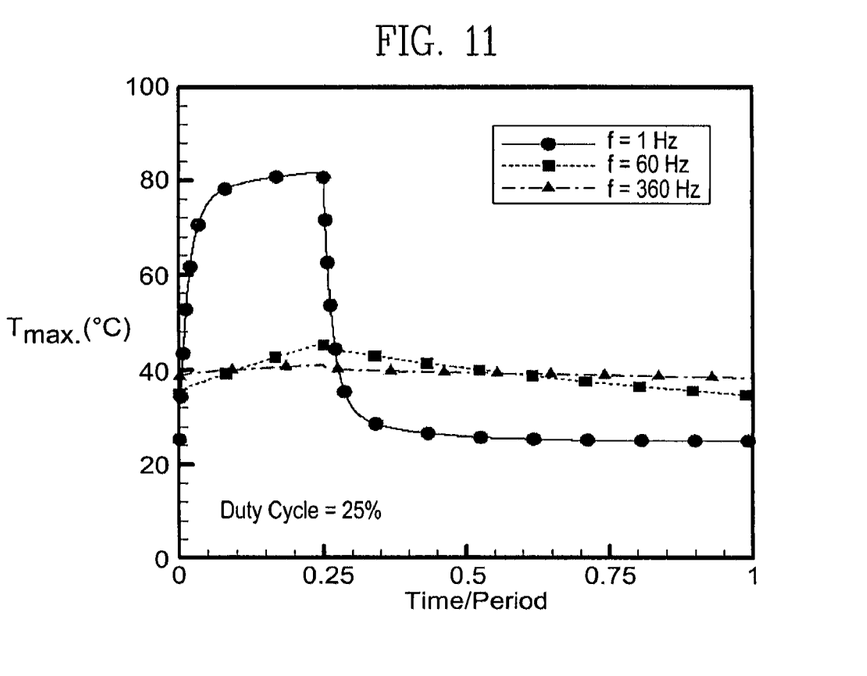
FIGS. 11 to 13 are graphs illustrating measured temperatures with respect to respective driving frequencies.
Figure 12:
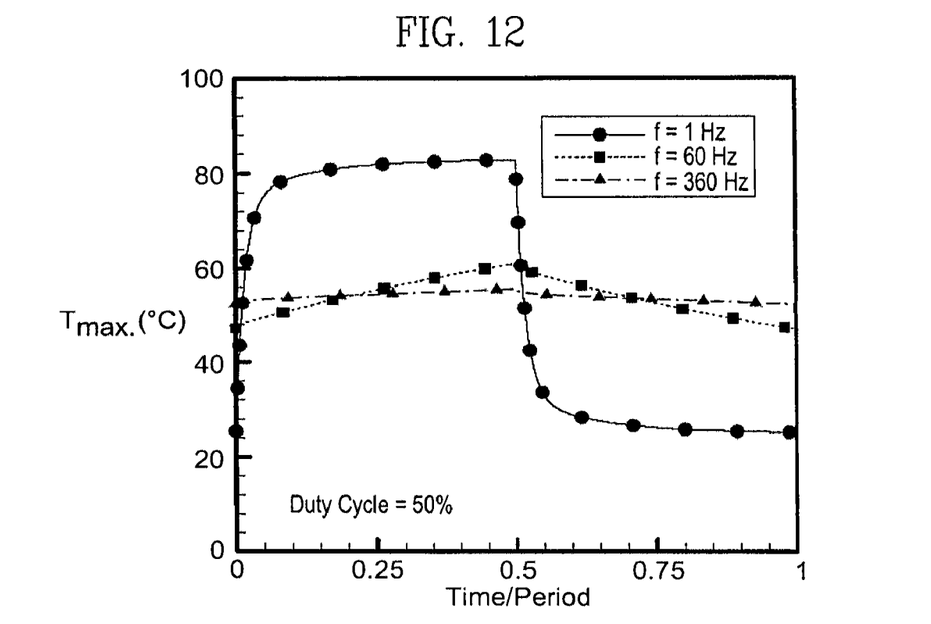
Figure 13:
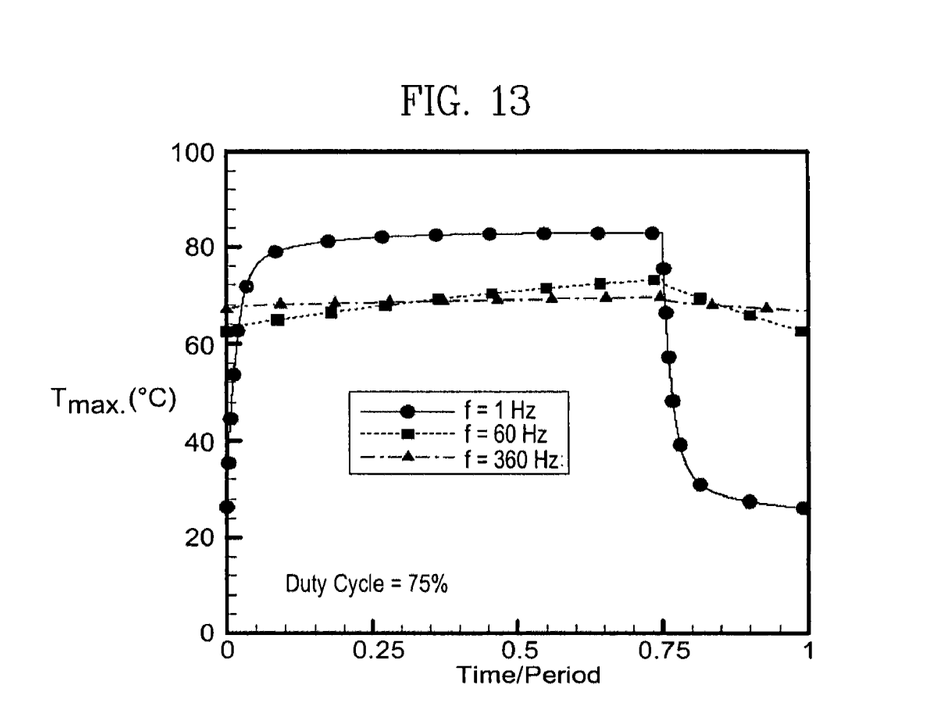

This is identical to those illustrated in FIGS. 11 to 13 and clearly represents the variation of the highest temperature of the light emitting device chip 20.

As the driving frequency increases, the highest temperature suddenly decreases and the rate of increment $\partial T/\partial t$ thereof significantly decreases. This is because the thermal equilibrium time of the light emitting device chip 20 is very short and the light emitting device chip 20 reaches the thermal equilibrium very rapidly due to the very rapid turning on/off switching at the high driving frequency.

Particularly, when the light emitting device package 100 is driven at low frequency about 1 Hz, the highest temperature is almost identical regardless of the duty cycle. In other words, the driving temperature measured at high frequency is low and reaches $(R_{LED\,package} + R_{external\,heatsin\,k}) \times \text{duty}$.

Accordingly, the thermal stress of the light emitting device chip 20 decreases as the driving frequency increases. In other words, the light emitting device package 100 driven at high frequency has higher reliability than the case of being driven at the low frequency.

Thus, according to the present invention, since the driving is enabled to estimate the junction temperature of the light emitting device within a small error range, possibly within 10%, without an indirect measurement and to estimate the junction temperature of the light emitting device, it is possible to design to minimize the thermal stress in the light emitting device package and the display and the backlight unit including the light emitting device package.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An operating system of a light emitting device comprising:
   a light emitting diode package comprising:
     a light emitting diode chip; and
     a heat sink thermally connected to the light emitting diode chip, the heat sink comprising a metal; and
   a driving unit to drive the light emitting diode package at frequency equal to or higher than 100 Hz, the driving unit performing a duty operation,
   wherein the frequency is configured to decrease an operational temperature of the light emitting diode chip, and wherein the driving unit is configured to estimate a junction temperature of the light emitting diode chip within 10% of an error range, and wherein the junction temperature T of the light emitting diode chips is estimated by a formula, $T=T_a+(R_{LED\ package}+R_{external\ heat\ sin\ k})\times W\times duty$, where $T_a$ is ambient temperature, R is thermal resistance, and W is heat discharge of the light emitting diode chips.

2. The operating system of a light emitting device according to claim 1, further comprising a solder ball, and an epoxy positioned between the light emitting diode chip and the heat sink.

3. The operating system of a light emitting device according to claim 1, further comprising an encapsulant and a lens disposed in the upper side of the light emitting diode chip.

4. The operating system of a light emitting device according to claim 1, wherein the light emitting diode chip comprises one of light emitting diode chips based on GaAs, InP, InGaP, and GaN.

5. The operating system of a light emitting device according to claim 1, wherein the driving unit drives the light emitting diode package at frequency equal to or less than 2 KHz.

6. The operating system of a light emitting device according to claim 1, wherein the number of the light emitting diode package is plural.

7. The operating system of a light emitting device according to claim 6, wherein the light emitting diode packages are arranged in a panel having a predetermined area.

8. The operating system of a light emitting device according to claim 1, wherein the junction temperature of the light emitting diode chip is estimated by thermal resistance of the light emitting diode package or the heat sink.

9. An operating system of a light emitting device comprising:
a plurality of light emitting diode chips;
a heat sink thermally connected to the plurality of light emitting diode chips, the heat sink comprising a metal; and
a driving unit to drive the light emitting diode chips at frequency equal to or higher than 100 Hz, the driving unit performing a duty operation,
wherein the frequency is configured to decrease an operational temperature of the light emitting diode chips, and
wherein the driving unit is configured to estimate a junction temperature of the light emitting diode chips within 10% of an error range, and
wherein the junction temperature T of the light emitting diode chips is estimated by a formula, $T=T_a+(R_{LED\ package}+R_{external\ heat\ sin\ k})\times W\times duty$, where $T_a$ is ambient temperature, R is thermal resistance, and W is heat discharge of the light emitting diode chips.

10. The operating system of a light emitting device according to claim 9, wherein the plural light emitting diode chips emit full colored light.

11. The operating system of a light emitting device according to claim 9, wherein the driving unit the light emitting diode chips at frequency equal to or less than 2 KHz.

12. The operating system of a light emitting device according to claim 9, wherein each of the light emitting diode chips comprises one of light emitting based on GaAs, InP, InGaP, and GaN.

13. The operating system of a light emitting device according to claim 9, wherein the junction temperature of the light emitting diode chips is estimated by thermal resistance of the heat sink.

14. A method of driving a light emitting device comprising at least one light emitting diode package, comprising:
driving the light emitting diode package at frequency equal to or higher than 100 Hz, by performing a duty operation, wherein the light emitting diode package comprises a light emitting diode chip and a heat sink thermally connected to the light emitting diode chip,
wherein the heat sink comprises a metal, wherein the frequency is configured to decrease an operational temperature of the light emitting diode chip,
wherein the driving unit is configured to estimate a junction temperature of the light emitting diode chip within 10% of an error range, and
wherein the junction temperature T of the light emitting diode chips is estimated by a formula, $T=T_a+(R_{LED\ package}+R_{external\ heat\ sin\ k})\times W\times duty$, where $T_a$ is ambient temperature, R is thermal resistance, and W is heat discharge of the light emitting diode chips.

15. The method of driving a light emitting device according to claim 14, wherein the frequency is equal to or less than 2 KHz.

16. The method of driving a light emitting device according to claim 14, wherein the junction temperature of the light emitting diode chip is estimated by thermal resistance of the light emitting diode package or the heat sink.

* * * * *